(12) United States Patent
Snider

(10) Patent No.: US 6,606,252 B1
(45) Date of Patent: Aug. 12, 2003

(54) FASTENER DETECTION FOR ENCASED ELECTRICAL ASSEMBLY

(75) Inventor: Chris R. Snider, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/196,813

(22) Filed: Jul. 17, 2002

(51) Int. Cl.[7] .................................................. H05K 7/10
(52) U.S. Cl. ...................... 361/777; 361/724; 361/797; 361/800; 361/799; 174/51; 174/262
(58) Field of Search ................................. 361/752, 777, 361/724, 797, 800, 799, 730, 760, 764, 774, 775, 785; 174/51, 262

(56) References Cited

U.S. PATENT DOCUMENTS 5,991,164 A * 11/1999 Saito et al. .................. 361/799
6,350,949 B1 * 2/2002 Boyd ......................... 174/50.5

* cited by examiner

Primary Examiner—David Martin
Assistant Examiner—Hung Bui
(74) Attorney, Agent, or Firm—Stefan V. Chmielewski

(57) ABSTRACT

An encased electrical assembly includes a housing, a printed circuit board (PCB) and a cover. The housing includes a plurality of receiving apertures and the PCB includes a plurality of securing apertures shaped to receive a conductive fastener for securing the PCB to the housing. The PCB includes a plurality of conductive traces with two of the conductive traces having first ends electrically connected to a different one of two electrical contacts that are electrically accessible from outside the housing and second ends routed to different ones of the securing apertures. Each of the remaining conductive traces are routed between a different pair of the securing apertures such that when each of the securing apertures receives a secured conductive fastener, continuity is achieved between all of the conductive traces. The cover, when attached to the housing, obscures at least one of the conductive fasteners. However, the presence of the conductive fasteners can be determined by performing a continuity check between the two electrical contacts.

18 Claims, 3 Drawing Sheets

FASTENER DETECTION FOR ENCASED ELECTRICAL ASSEMBLY

TECHNICAL FIELD

The present invention is generally directed to an encased electrical assembly, and, more specifically, to fastener detection for an encased electrical assembly.

BACKGROUND OF THE INVENTION

Various electrical assemblies are encased within enclosures. For example, many automotive control assemblies include a printed circuit board (PCB) that is affixed to a housing, case or mounting structure with conductive fasteners, e.g., metal screws. In many cases, the fasteners that attach the PCB to the case, housing or mounting structure are obscured by a cover that forms a part of a final assembly, which includes the PCB installed in the case, housing or mounting structure. For example, PCBs of many automotive control assemblies may be included within a housing that includes a cover, which obscures view of the fasteners that attach the PCB to the housing. Unfortunately, in many situations when a fastener is not installed or is not properly installed an electrical failure of the control assembly may occur during operation of the assembly and its associated motor vehicle. For example, vibration during operation of the motor vehicle may cause an electrical malfunction within a control assembly due to a vibration induced intermittent open in a signal path of the control assembly.

In an effort to verify that PCB fasteners are properly installed in assemblies that may include one or more fasteners that are inaccessible or not visible when installed in an assembly, designers have produced a number of test systems to check for the presence of fasteners. For example, solenoid driven probes have been implemented within test fixtures to determine the physical presence of fasteners in a control assembly. However, such test fixtures can be expensive and in assemblies that utilize multiple PCBs, multiple test stations and/or test fixtures may be required, which add to the cost of an end product.

Thus, what is needed is a technique for determining the presence of fasteners that affix a printed circuit board (PCB) to a housing that does not require customized test fixtures for determining the presence of the fasteners. It would also be desirable for the technique to determine whether the fasteners are properly secured to the housing.

SUMMARY OF THE INVENTION

According to an embodiment of the present invention, an encased electrical assembly includes a housing, a printed circuit board (PCB) and a cover, which, when attached to the housing, obscures at least one of the conductive fasteners. The housing includes a plurality of receiving apertures and the PCB includes a plurality of securing apertures shaped to receive a conductive fastener for securing the PCB to the housing. The PCB includes a plurality of conductive traces with two of the conductive traces having first ends electrically connected to a different one of two electrical contacts that are electrically accessible from outside the housing and second ends routed to different ones of the securing apertures. Each of the remaining conductive traces are routed between a different pair of the securing apertures such that when each of the securing apertures receives a secured conductive fastener, continuity is achieved between all of the conductive traces.

Thus, according to the present invention, the presence of conductive fasteners can be determined by performing a continuity check between two electrical contacts. According to another embodiment of the present invention, the conductive fastener can be one of a machine screw, a metal screw and a bolt. According to other embodiments of the present invention, the two electrical contacts may be separate header pins or separate test points.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENT(S)

According to an embodiment of the present invention, an encased electrical assembly that includes a housing, a printed circuit board (PCB) mounted to the housing with conductive fasteners and a cover that obscures one or more of the fasteners can be readily examined to determine proper mounting of the PCB to the housing. In a typical case, the housing includes a plurality of receiving apertures and the PCB includes a plurality of securing apertures shaped to receive a conductive fastener for securing the PCB to the housing. According to one embodiment, the PCB includes a plurality of conductive traces with two of the conductive traces having first ends electrically connected to a different one of two electrical contacts that are electrically accessible from outside the housing and second ends routed to different ones of the securing apertures. Each of the remaining conductive traces are routed between a different pair of the securing apertures such that when each of the securing apertures receives a secured conductive fastener, continuity is achieved between all of the conductive traces. Thus, even though the cover, when attached to the housing, obscures at least one of the conductive fasteners, the presence of the fasteners can be determined by performing a continuity check between the two electrical contacts.

According to another embodiment of the present invention, the conductive fastener can be one of a machine screw, a metal screw and a bolt. According to other embodiments of the present invention, the two electrical contacts may be separate header pins or separate test points.

Figure 1:
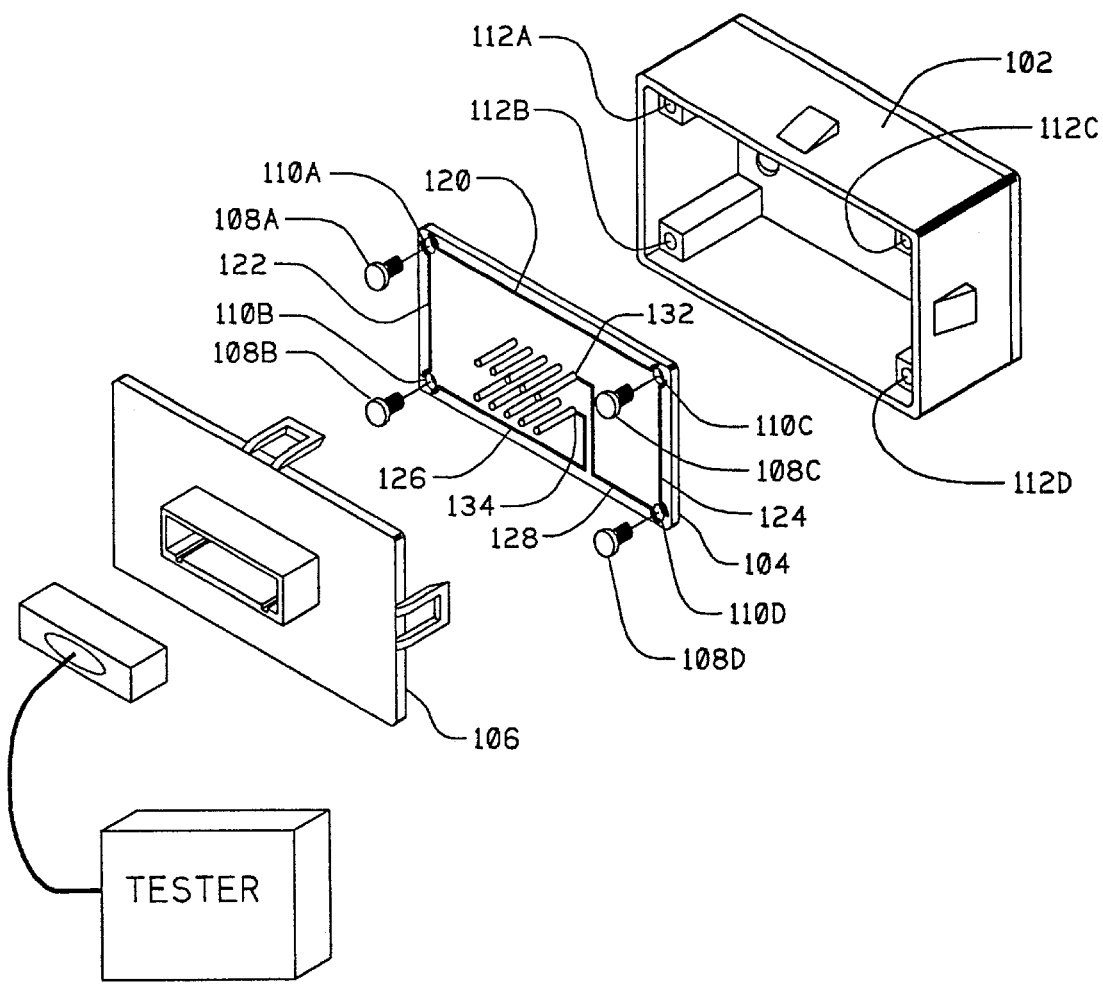
FIG. 1 is an exploded view of an exemplary encased electrical assembly, constructed according to one embodiment of the present invention.

FIG. 1 depicts an exemplary encased electrical assembly that includes a housing 102 that receives a printed circuit board (PCB) 104. A cover 106 attaches to the housing 102 and, when attached to the housing 102, obscures conductive fasteners 108A–108D. The PCB 104 includes securing apertures 110A–110D that receive conductive fasteners 108A–108D, respectively. For sake of clarity, electronic circuitry mounted to and traces formed on the PCB 104, in a typical control assembly, are not depicted as the present invention is applicable to virtually any PCB.

When the PCB 104 is secured to the housing 102, the fasteners 108A–108D are received by the receiving apertures 112A–112D formed in the housing 102. The PCB 104 includes a first conductive trace 120 that runs between apertures 110A and 110C, a second conductive trace 122 that runs between apertures 110A and 110B and a third conductive trace 124 that runs between apertures 110C and 110D. A conductive trace 126 includes a first end connected to an electrical contact 134 and a second end located adjacent the securing aperture 110B. The conductive trace 128 includes a first end coupled to a contact 132 and a second end located adjacent the aperture 110D. In this manner, a tester, whose test cable is coupled to the contacts 132 and 134, can check for continuity between the contacts 132 and 134 and, thus, determine whether the fasteners 108A–108D are present.

Figure 2:
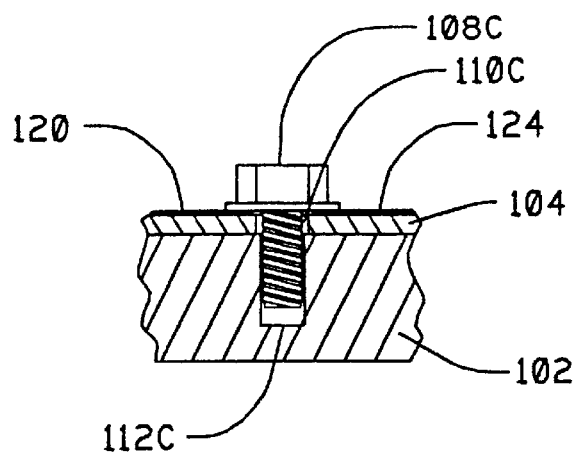
FIG. 2 is a partial cross-sectional view of a printed circuit board (PCB) mounted to a housing, according to an embodiment of the present invention.

FIG. 2 depicts a partial cross-sectional view of the housing 102 and the PCB 104 at the receiving aperture 112C. As is shown in FIG. 2, the conductive fastener 108C is routed through the securing aperture 110C in the PCB 104 and is threadingly received by the receiving aperture 112C, which is formed in housing 102. The PCB 104 includes a first conductive trace 120 and a second conductive trace 124. As is shown in FIG. 1, and as described above, when the conductive fastener 108C is properly secured in the receiving aperture 112C of the housing 102, electrical contact is made between the trace 120 and the trace 124. With reference again to FIG. 1, when all of the conductive fasteners 108A–108D are routed through their respective securing apertures 110A–110D and properly engaged with their respective receiving apertures 112A–112D and tightened thereto, the traces 120–128 are in electrical contact and, thus, provide an indication that fasteners 108A–108D are in place and properly secured to the housing 102, via the contacts 132 and 134. That is, continuity can be determined by, for example, connecting an ohm meter to the contacts 132 and 134 and determining the resistance between the points. When the cover 106 is coupled to the housing 102, thus, obscuring the view of the fasteners 108A–108D, an external device, e.g., a tester with an associated test cable, coupled to the contacts 132 and 134 can determine whether the fasteners 108A–108D are present and secured to the housing 102. It should be appreciated that a number of different conductive fasteners can be utilized such as machine screws, metal screws and bolts providing that heads of the fasteners are properly shaped to establish continuity between traces that are adjacent a securing aperture in a PCB.

Figure 3:
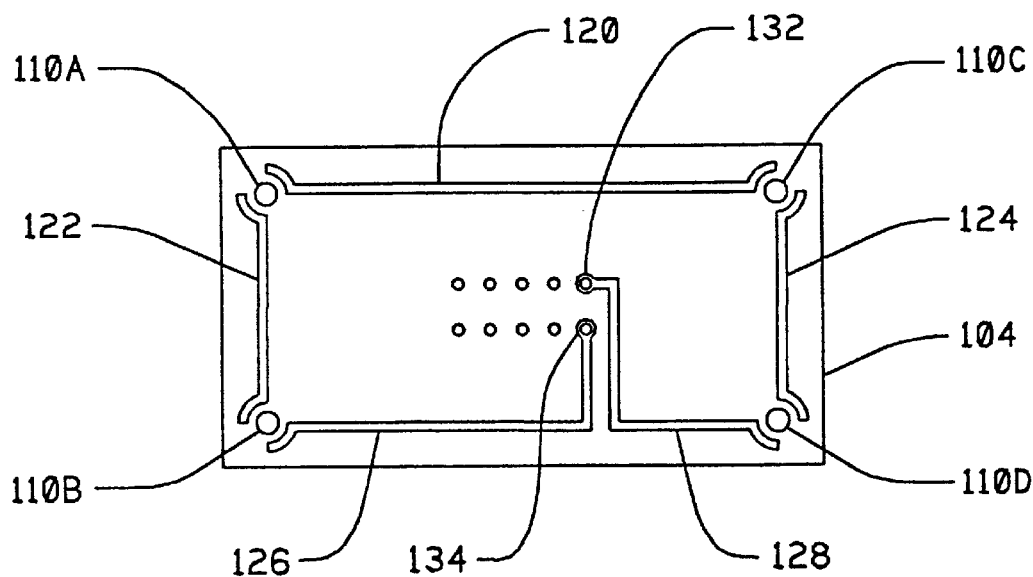
FIG. 3 is a front view of a PCB, according to one embodiment of the present invention.
Figure 4:
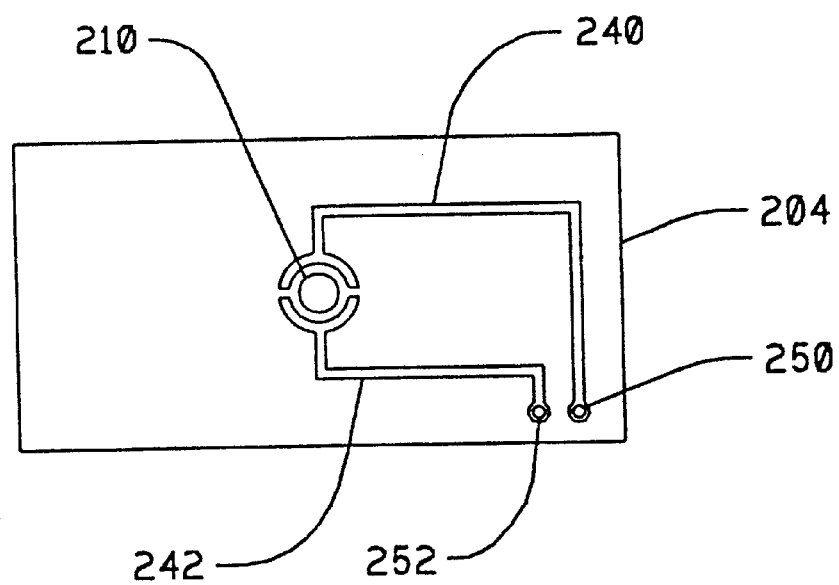
FIG. 4 is a front view of a PCB, according to another embodiment of the present invention.

FIG. 3 depicts a front view of the PCB 104, according to one embodiment of the present invention. FIG. 4 depicts a PCB 204, which is configured according to another embodiment of the present invention. As is shown in FIG. 4, the PCB 204 includes a center securing aperture 210, which is shaped to receive a conductive fastener, which secures the PCB 204 to a structure, for example, a housing. As is shown in FIG. 4, a conductive trace 204 includes a first end connected to a contact 250 and a second end that is adjacent the aperture 210. A second electrical trace 242 includes a first end that is coupled to an electrical contact 252 and a second end that is located adjacent the securing aperture 210. In this manner, a device connected to the electrical contacts 250 and 252 can determine if the conductive fastener has established electrical continuity between the traces 240 and 242 and, thus, whether a conductive fastener has properly secured the PCB 204 to a desired structure.

Accordingly, an encased electrical assembly has been described herein which advantageously allows for the determination of whether a printed circuit board (PCB) is properly secured in a housing or case or to a mounting structure. Such an electrical assembly is especially advantageous when implemented in the automotive environment, which frequently utilizes electrical assemblies that include a PCB whose associated conductive fasteners are obscured from view by a cover.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the Doctrine of Equivalents.

What is claimed is:

1. An encased electrical assembly, comprising:

a housing including a receiving aperture;

a printed circuit board (PCB) including a securing aperture for securing the PCB to the housing, wherein the securing aperture is shaped to receive a conductive fastener and the PCB includes two conductive traces with first ends electrically connected to a different one of two electrical contacts that are electrically accessible from outside the housing, and wherein a second end of the two conductive traces is located adjacent the securing aperture such that when the conductive fastener is present and secured continuity is achieved between the second ends of the two conductive traces; and a cover for attaching to the housing, wherein the cover obscures the conductive fastener when attached to the housing.

2. The assembly of claim 1, wherein the conductive fastener is one of a machine screw, a metal screw and a bolt.

3. The assembly of claim 1, wherein the two electrical contacts are separate header pins.

4. The assembly of claim 1, wherein the two electrical contacts are separate test points.

5. An encased electrical assembly, comprising:

a housing including a plurality of receiving apertures;

a printed circuit board (PCB) including a plurality of securing apertures for securing the PCB to the housing, wherein the PCB includes a plurality of conductive traces with two of the conductive traces having first ends electrically connected to a different one of two electrical contacts that are electrically accessible from outside the housing and second ends routed to different ones of the securing apertures, and wherein each of the remaining conductive traces are routed between a different pair of the securing apertures such that when each of the securing apertures receives a secured conductive fastener continuity is achieved between all of the conductive traces; and a cover for attaching to the housing, wherein the cover obscures at least one of the conductive fasteners when attached to the housing.

6. The assembly of claim 5, wherein the conductive fastener is one of a machine screw, a metal screw and a bolt.

7. The assembly of claim 5, wherein the two electrical contacts are separate header pins.

8. The assembly of claim 5, wherein the two electrical contacts are separate test points.

9. A printed circuit board (PCB), comprising:

a flat base including a plurality of securing apertures for securing the PCB to a housing; and a plurality of conductive traces formed on the flat base with two of the conductive traces having first ends electrically connected to a different one of two electrical contacts and second ends routed to different ones of the securing apertures, and wherein each of the remaining conductive traces are routed between a different pair of the securing apertures such that when each of the securing apertures receives a secured conductive fastener continuity is achieved between all of the conductive traces.

10. The PCB of claim 9, wherein the conductive fastener is one of a machine screw, a metal screw and a bolt.

11. The PCB of claim 9, wherein the two electrical contacts are separate header pins.

12. The PCB of claim 9, wherein the two electrical contacts are separate test points.

13. The PCB of claim 9, wherein the PCB is received in a housing that has a plurality of receiving apertures that each receive one of the conductive fasteners.

14. The PCB of claim 10, wherein a cover when attached to the housing obscures at least one of the conductive fasteners.

15. An assembly coupled to a mounting structure that has a plurality of receiving apertures, the assembly comprising:

a printed circuit board (PCB) including a plurality of securing apertures for securing the PCB to the mounting structure, wherein the PCB includes a plurality of conductive traces with two of the conductive traces having first ends electrically connected to a different one of two electrical contacts that are electrically accessible from outside the mounting structure and second ends routed to different ones of the securing apertures, and wherein each of the remaining conductive traces are routed between a different pair of the securing apertures such that when each of the securing apertures receives a secured conductive fastener continuity is achieved between all of the conductive traces; and a cover for attaching to the mounting structure, wherein the cover obscures at least one of the conductive fasteners when attached to the mounting structure.

16. The assembly of claim 15, wherein the conductive fastener is one of a machine screw, a metal screw and a bolt.

17. The assembly of claim 15, wherein the two electrical contacts are separate header pins.

18. The assembly of claim 15, wherein the two electrical contacts are separate test points.

* * * * *